United States Patent
Kneissl et al.

(10) Patent No.: US 6,744,800 B1
(45) Date of Patent: Jun. 1, 2004

(54) METHOD AND STRUCTURE FOR NITRIDE BASED LASER DIODE ARRAYS ON AN INSULATING SUBSTRATE

(75) Inventors: Michael A. Kneissl, Sunnyvale, CA (US); Thomas L. Paoli, Los Altos, CA (US); David P. Bour, Cupertino, CA (US); Noble M. Johnson, Menlo Park, CA (US); Jack Walker, Georgetown, TX (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/223,112

(22) Filed: Dec. 30, 1998

(51) Int. Cl.[7] .............................................. H01S 5/00
(52) U.S. Cl. ................................................. 372/50
(58) Field of Search ............................ 372/50, 75, 45, 372/46; 347/238

(56) References Cited

U.S. PATENT DOCUMENTS

| 5,012,477 | A | * | 4/1991 | Mesquida et al. | 372/50 |
| 5,325,384 | A | * | 6/1994 | Herb et al. | 372/36 |
| 5,642,373 | A | * | 6/1997 | Kamizato et al. | 372/50 |
| 5,793,405 | A | * | 8/1998 | Shakuda | 347/248 |
| 5,812,576 | A | * | 9/1998 | Bour | 372/45 |
| 6,031,858 | A | * | 2/2000 | Hatakoshi et al. | 372/46 |
| 6,072,818 | A | * | 6/2000 | Hayakawa | 372/46 |
| 6,136,623 | A | * | 10/2000 | Hofstetter et al. | 372/50 |

FOREIGN PATENT DOCUMENTS

| EP | 0 779 690 A2 | * | 6/1997 | H01S/3/25 |
| JP | 62-268177 A | * | 11/1987 | 372/43 |
| JP | 09-266352 | * | 10/1997 | |

OTHER PUBLICATIONS

A. Kuramata, S. Kubota, R. Soejima, K. Domen, K. Horino and T. Tanahashi. "Room–Temperature Continuous Wave Operation of InGaN Laser Diodes with Vertical Conducting Structure on SiC Substrate". *Japanese Journal of Applied Physics*, vol. 37, Part 2, No. 11B, Nov. 15, 1998, pp. L1373–L1375.

S. Nakamura, M. Senoh, S. Nagahama, N. Iwasa, T. Yamada, T. Matsuhita, H. Kiyoku, Y. Sugimoto, T. Kozaki, H. Umemoto, M. Sano and K. Chocho. "Continuous–wave operation of InGaN/GaN/AlGaN–based laser diodes grown on GaN substrates". *Applied Physics Letters*, vol. 72, No. 16, Apr. 10, 1998, pp. 2014–2016.

S. Nakamura, M. Senoh, S. Nagahama, N. Iwasa, T. Yamada, T. Matsuhita, H. Kiyoku, Y. Sugimoto, T. Kozaki, H. Umemoto, M. Sano and K. Chocho. "InGaN/GaN/AlGaN–based laser diodes with modulation–doped strained–layer superlattices grown on an epitaxially laterally overgrown GaN substrate", *Applied Physics Letters*, vol. 72, No. 2, Jan. 1998, pp. 211–213.

S. Nakamura, G. Fasol. *The Blue Laser Diode. GaN Based Light Emitters and Lasers*. New York: Springer, 1997. pp. 34–47, 190–193 & 223–259, no month available.

* cited by examiner

Primary Examiner—Quyen Leung (57) ABSTRACT

A method and structure for nitride based laser diode arrays on an insulating substrate is described. Various contact layouts are used to reduce electrical and thermal crosstalk between laser diodes in the array. A channel structure is used to make a surface emitting laser diode while maintaining a simple contact structure. Buried layers are used to provide a compact and low crosstalk contact structure for the laser diode array.

19 Claims, 12 Drawing Sheets

METHOD AND STRUCTURE FOR NITRIDE BASED LASER DIODE ARRAYS ON AN INSULATING SUBSTRATE

CROSS-REFERENCE TO RELATED APPLICATIONS

The present invention is related to copending application "Structure for Nitride Based Laser Diode Arrays on a Conducting Substrate" by M. A. Kneissl, D. P. Bour, N. M. Johnson, and J. Walker Ser. No. 09/224,254, filed on the same day and assigned to the same assignee which is hereby incorporated by reference in its entirety.

STATEMENT REGARDING FEDERALLY SPONSORED RESEARCH OF DEVELOPMENT

The U.S. Government has a fully paid-up license in this invention and the right in limited circumstances to require the patent owner to license others on reasonable terms as provided for by the terms of contract no. 70NANB 2H-1241 awarded by the Department of Commerce.

BACKGROUND OF THE INVENTION

The present invention relates generally to the field of laser diodes, and more particularly to architecture for short-wavelength nitride based laser diode arrays.

Short-wavelength nitride based laser diodes provide smaller spot size and a better depth of focus than red and infrared (IR) laser diodes for laser printing operations and other applications. Single-spot nitride laser diodes have applications in areas such as optical storage.

Laser diode arrays are desirable for application to high speed laser printing. Printing at high speeds and at high resolution requires laser arrays due to the fundamental limits of polygon rotation speed, laser turn-on times and laser power. Laser diode arrays have previously been employed using red and infrared laser diode structures. Dual-spot red lasers and quad-spot infrared lasers have been used for laser printers.

Laser diodes based on higher bandgap semiconductor alloys such as AlGaInN have been developed. Excellent semiconductor laser characteristics have been established in the near-UV to violet spectrum, principally by Nichia Chemical Company of Japan. See for example, A. Kuramata et al., "Room-temperature CW operation of InGaN Laser Diodes with a Vertical Conducting Structure on SiC Substrate", Japanese Journal of Applied Physics, Vol. 37, L1373 (1998), S. Nakamura et al., "CW Operation of InGaN/GaN/AlGaN-based laser diodes grown on GaN substrates", Applied Physics Letters, Vol. 72(6), 2014 (1998) and S. Nakamura and G. Fasol, "The Blue Laser Diode-GaN based Light Emitters and Lasers", (Springer-Verlag, 1997) all of which are incorporated by reference in their entirety.

Extension of dual-spot lasers to shorter wavelengths enables printing at higher resolution. However, the architecture for short-wavelength laser diode arrays needs to be different when nitride based laser diodes are used in arrays because mirrors need to be formed by dry etching instead of cleaving and nitride based devices are mostly grown on insulating substrates such as sapphire.

SUMMARY OF THE INVENTION

Architectures using insulating substrates allow the economical construction of nitride based quad-spot diode laser and surface-emitting dual-quad-spot laser diode arrays. Currently, most advanced nitride based single laser structures are grown on insulating sapphire ($Al_2O_3$) substrates. The use of insulating substrates for laser diode arrays presents a special problem in providing electrical contacts for the laser diodes. In contrast to the situation where conducting substrates are used, insulating substrates cannot provide a common contact for all laser diodes in an array. Hence, providing electrical contacts to laser diode arrays on insulating substrates requires the use of special architectures.

Dual spot and quad spot laser diodes built on an insulating substrate can be electrically contacted using an architecture with surface contacts for both anode and cathode. Two laser diodes may share a common n-contact or p-contact. Alternatively, each laser diode may have separate n-and p-contacts. Providing separate contacts for each laser diode greatly reduces electrical and thermal crosstalk but complicates the laser diode architecture. In quad spot laser diodes, two laser diodes may be aligned at an angle with respect to the other two laser diodes to achieve further reduction in electrical and particularly thermal crosstalk if necessary.

Alternatively, laser diodes built on an insulating substrate as an array may be contacted using multiple buried layers isolated from each other by blocking layers of opposite conductivity or by insulating layers. This allows good isolation of the conducting layers while still maintaining good conductivity. Alternating layers of opposite conductivities form p-n junctions that are reverse-biased under forward bias operation of the laser diode array. As a result, a buried isolated current channel is produced for each laser diode in the laser array. Alternating doped layers with insulating layers also forms a buried isolated current channel for each laser diode in the laser array. The insulating layers provide electrical blocking between the doped layers to isolate the current channel. Blocking layers may be epitaxially grown.

Since it is very difficult to obtain high quality mirror facets by cleaving because of the cleave plane mismatch between GaN and $Al_2O_3$, laser mirrors for laser diodes on insulating substrates are most often obtained by using either dry-etched vertical facets (i.e. chemically assisted ion -beam etching) or by integrating a distributed Bragg reflecting mirror into the laser device structure.

The ability to use insulating substrates for short wavelength nitride based lasers by employing special architectures offers a significant economic savings for laser diode array structures as well as allowing use of proven techniques for their manufacture.

Thus, the present invention and its various embodiments provide numerous advantages as will be described in further detail below.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

FIG. 5b shows a cross-sectional view of the embodiment shown in FIG. 5a.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the embodiments. These recited materials are to be treated as exemplary, and are not intended to limit the scope of the claims hereof.

Figure 1:
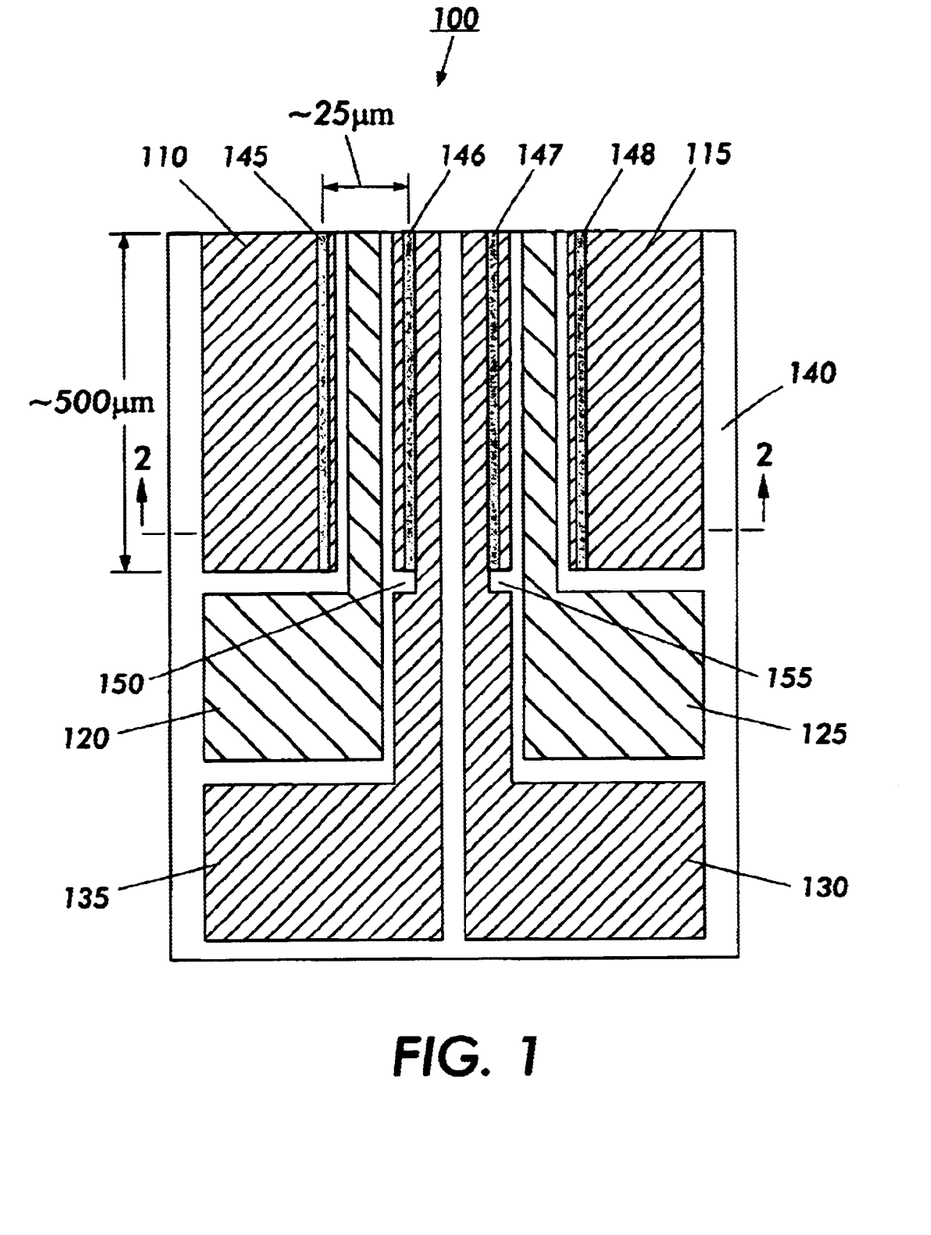
FIG. 1 shows a top view of the layout of a quad-spot laser diode structure in an embodiment in accordance with the present invention.

An embodiment in accordance with the present invention is shown in FIG. 1. FIG. 1 shows quad-spot InGaAlN laser diode structure 100 typically grown on $Al_2O_3$ insulating substrate 215 (see FIG. 2). Structure 100 shows laser diodes 145 and 146 sharing n metal contact 120 and laser diodes 147 and 148 sharing n-metal contact 125. P-metal contact 110 connects to laser diode 145, p-metal contact 135 connects to laser diode 146, p-metal contact 130 connects to laser diode 147 and p-metal contact 115 connects to laser diode 148. The lateral separation between adjacent laser diodes shown in FIG. 1 is about 25 μm. For example, the separation between laser diodes 145 and 146 is about 25 μm. The length of laser diode structures 145, 146, 147 and 148 is typically about 500 μm. Isolation layer 140 is made of a dielectric material, typically, silicon oxy-nitride, silicon dioxide, silicon nitride or polyimide. Notches 150 and 155 in p-metal contacts 135 and 130, respectively, provide open space for subsequent evaporation of a dielectric high reflective coating, for example, $TiO_2/SiO_2$.

Figure 2:
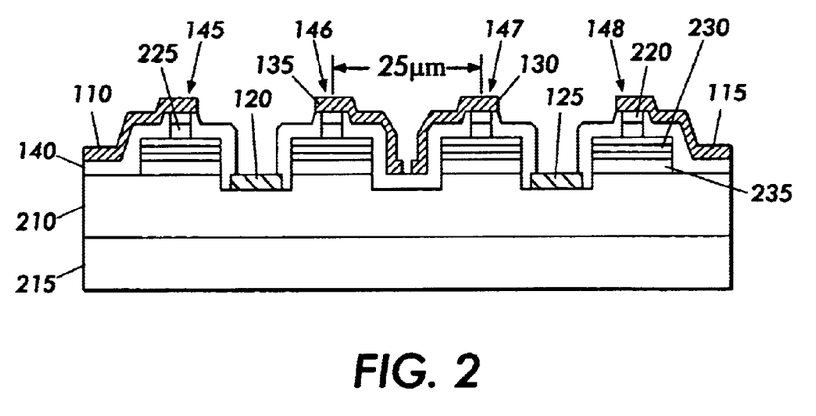
FIG. 2 shows a cross-sectional view of the embodiment in FIG. 1.

FIG. 2 shows a cross-sectional view of quad-spot InGaAlN laser diode structure 100. P-GaN cap layer 220 is positioned atop p-AlGaN cladding layer 225. The active region is InGaN layer 230 that has a multi-quantum well structure and is positioned on n-AlGaN cladding layer 235. Layer 210 is n-GaN and resides on insulating substrate 215 which is typically $Al_2O_3$.

Figure 3:
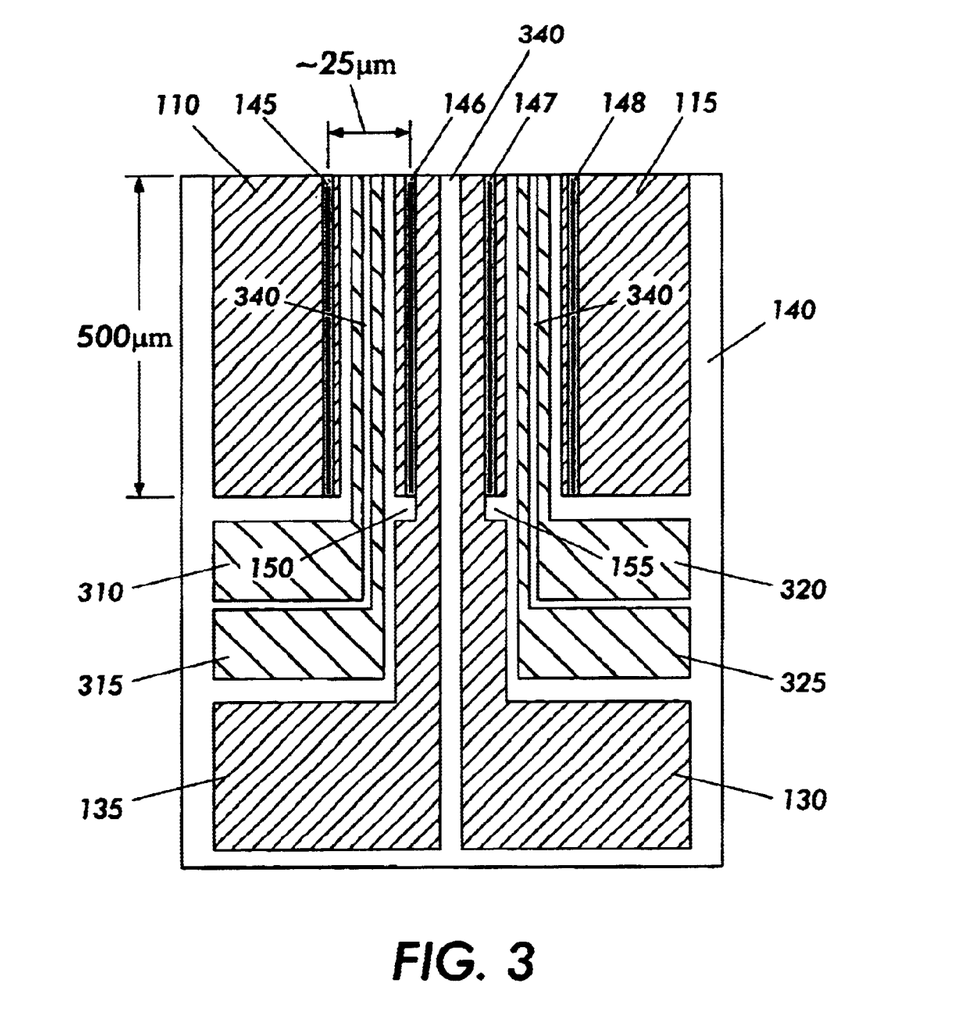
FIG. 3 shows a top view of the layout of a quad-spot laser diode structure in an embodiment in accordance with the present invention.

FIG. 3 shows an alternative quad-spot InGaAlN laser diode structure 300 typically grown on $Al_2O_3$ insulating substrate 215 (see FIG. 2). Quad-spot InGaAlN laser diode structure 300 is similar to quad-spot InGaAlN laser diode structure 100 shown in FIG. 1 except that separate n-metal contacts 310, 315, 320 and 325 are provided for laser diode structures 145, 146, 147 and 148, respectively. Providing separate n- and p-metal contacts for each device minimizes electrical and thermal crosstalk. Additional reduction in crosstalk can be achieved by etching very deep isolation grooves 340 (see FIG. 3) to separate laser diode 145 from laser diode 146, to separate laser diode 146 from laser diode 147 and to separate laser diode 147 from laser diode 148. Isolation grooves 340 may penetrate down to insulating substrate 215 (see FIG. 2) but at a minimum, grooves 340 should penetrate below active region 230. This eliminates optical crosstalk and the electrical crosstalk caused by diffusion of injected carriers within active region 230.

Figure 4:
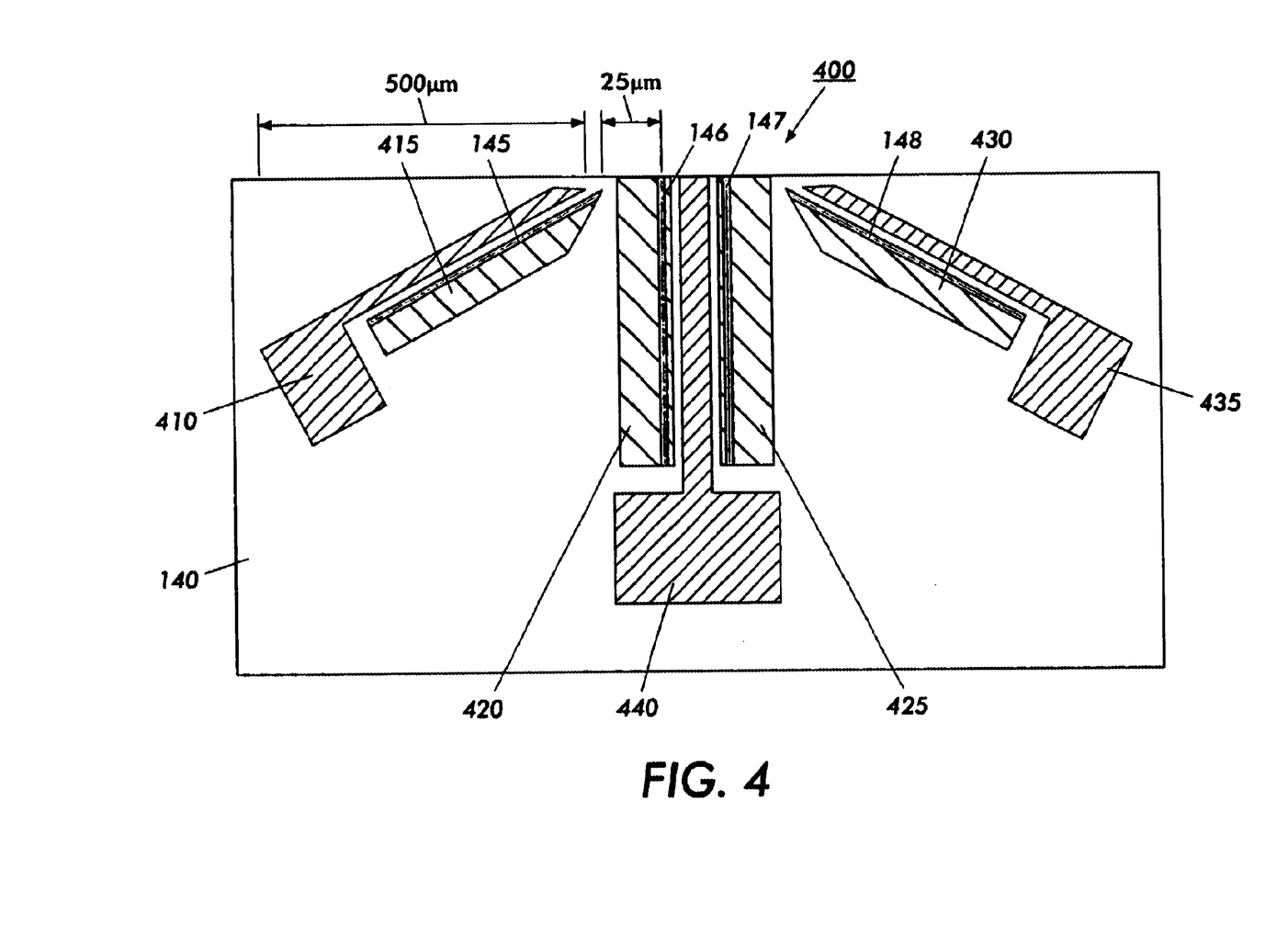
FIG. 4 shows a top view of the layout of a quad-spot laser diode structure in an embodiment in accordance with the present invention.

An embodiment in accordance with the present invention is shown in FIG. 4. Quad-spot InGaAlN laser diode structure 400 is grown on insulating substrate 215. Laser diodes 145 and 148 and associated n-metal and p-metal contacts 410, 435 and 415, 430, respectively, are aligned at an angle to provide more separation from laser diodes 146 and 147. The angle is chosen so that the resulting separation achieves a further reduction in electrical and especially thermal crosstalk. Laser diode 145 is provided electrical contact using n-metal contact 410 and p-metal contact 415 and laser diode 148 is provided electrical contact using n-metal contact 435 and p-metal contact 430. Laser diode 146 is provided electrical contact using p-metal contact 420 and n-metal contact 440. N-metal contact 440 is shared with laser diode 147 which has separate p-metal contact 425. N-metal contact 440 may be divided into two separate contacts to provide separate n-metal contacts to laser diodes 146 and 147 for a further reduction of electrical and thermal crosstalk.

Figure 5A:
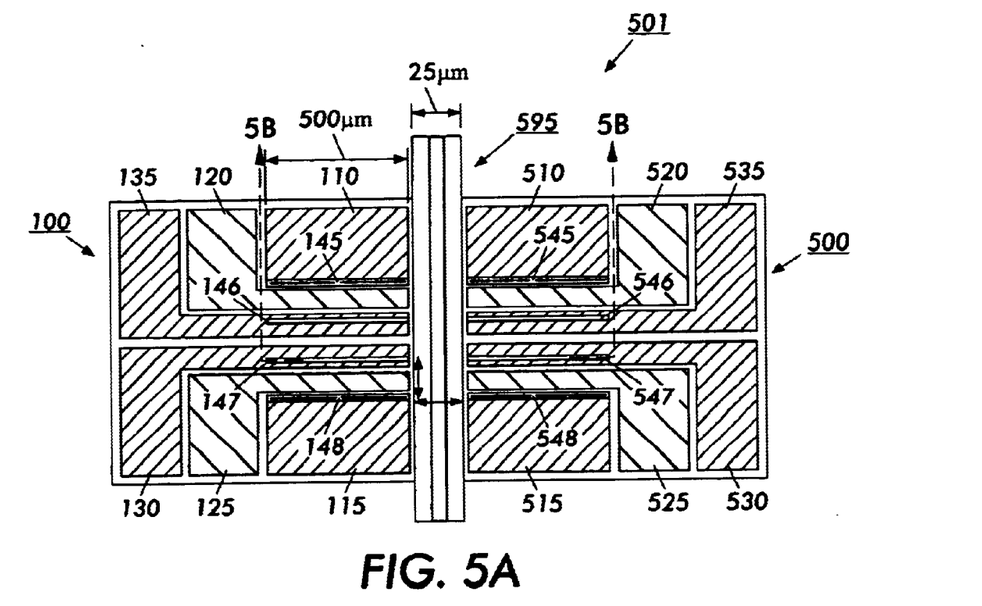
FIG. 5a shows a top view of the layout of a dual quad-spot laser diode structure in an embodiment in accordance with the present invention.
Figure 5B:
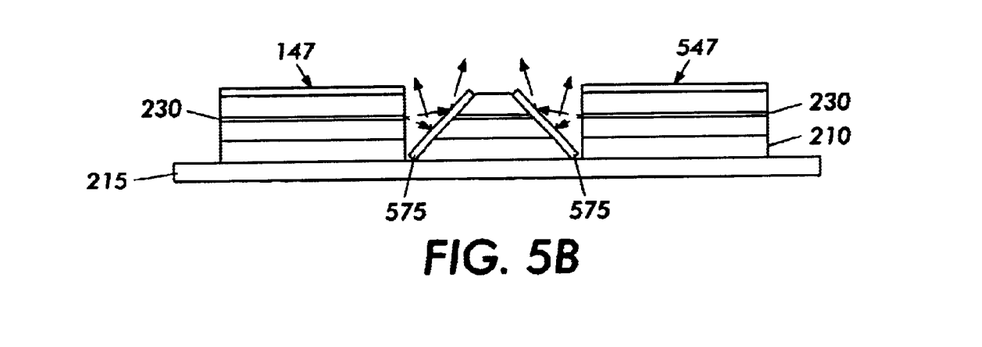

An embodiment in accordance with this invention of dual-quad-spot laser diode structure 501 is shown in FIGS. 5a and 5b. FIG. 5a shows the placement of quad-spot laser diode structure 100 on one side of channel structure 595 and corresponding mirror image laser diode structure 500 on the other side of channel structure 595 resulting in dual-quad-spot laser diode structure 501. Structure 500 has laser diodes 545 and 546 sharing n metal contact 520 and laser diodes 547 and 548 sharing n-metal contact 525. P-metal contact 510 connects to laser diode 545, p-metal contact 535 connects to laser diode 546, p-metal contact 530 connects to laser diode 547 and p-metal contact 515 connects to laser diode 548. The lateral separation between adjacent laser diodes shown in FIG. 1 is about 25 μm. For example, the separation between laser diodes 545 and 546 is about 25 μm. The length of laser diode structures 545, 546, 547 and 548 is typically about 500 μm. Structure 100 has been described above with reference to FIGS. 1 and 2.

FIG. 5b shows a cross-section of dual-quad-spot laser diode structure 501 along laser diode structures 147 and 547 and channel structure 595. Channel structure 595 contains tilted mirrors 575 (see FIG. 5b) for outcoupling light from laser diodes 145, 146, 147, 148, 545, 546, 547 and 548 into the vertical direction. Aluminum coated mirrors 575 are dry etched using, for example, chemically assisted ion-beam etching (CAIBE) and the inclination angle may be adjusted by varying etching parameters. A suitable inclination angle for mirror facets 575 in FIG. 5b is 45 degrees. The architecture shown in FIGS. 5a and 5b allows a closely spaced dual-quad-spot laser diode structure to be achieved. The spacing between adjacent laser diodes such as laser diodes 145 and 146 or 545 and 546 is typically 25 μm.

Figure 6:
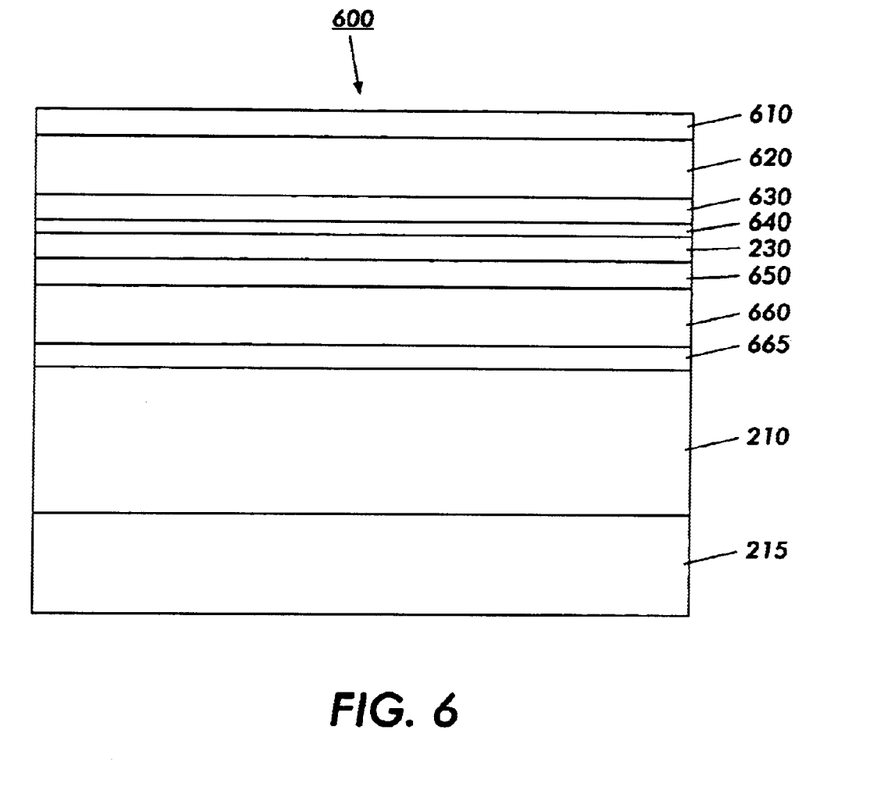
FIG. 6 shows the layers of a quad-spot laser diode structure in an embodiment accordance with the present invention.

In an embodiment in accordance with this invention, FIG. 6 shows InGaAlN heterostructure wafer 600 grown by metalorganic chemical vapor deposition (MOCVD) on insulating substrate 215. Insulating substrate 215 is typically $Al_2O_3$ and has a thickness typically ranging on the order of 100 μm to 400 μm. GaN:Mg cap layer 610 is 0.1 μm thick and adjoins $Al_{0.08}Ga_{0.92}N$:Mg cladding layer 620 which has a typical thickness in the range of 0.5 to 1.0 μm. Note that Mg is added to produce a p-type conductivity. A second GaN:Mg layer 630 also 0.1 μm thick lies underneath cladding layer 620 and serves as an p-doped waveguide. $Al_{0.2}Ga_{0.8}N$:Mg layer 640 is typically 20 nm thick and serves to create a tunnel barrier to prevent leakage of injected electrons. GaN:Si layer 650 functions as an n-doped waveguide for active region 230. Note that Si is added to produce an n-type conductivity. $Al_{0.08}Ga_{0.92}N$:Si cladding layer 660 has a typical thickness from 0.5 to 1.5 μm. $In_{0.03}Ga_{0.97}N$:Si layer 665 has a typical thickness of 50 nm and functions as a defect reducing layer.

GaN:Si layer 210 with a typical thickness of 4 μm lies above insulating substrate 215 and serves to establish a good quality material for subsequent depositions and to provide a lateral contact layer. Further details may be found in Nakamura and Fasol incorporated by reference above. Once structure 600 has been grown by MOCVD activation of Mg p-doping is performed in (Al)GaN:Mg layers 610, 620, 630 and 640. Activation of dopants is accomplished by rapid thermal annealing at 850° C. for 5 minutes in $N_2$ ambient.

Figure 7A:
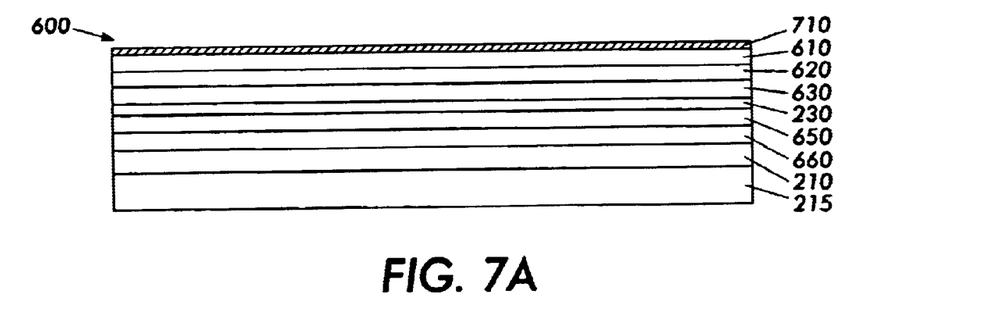
FIGS. 7a–7e show processing steps for a quad-spot laser diode structure in an embodiment in accordance with the present invention.
Figure 7B:
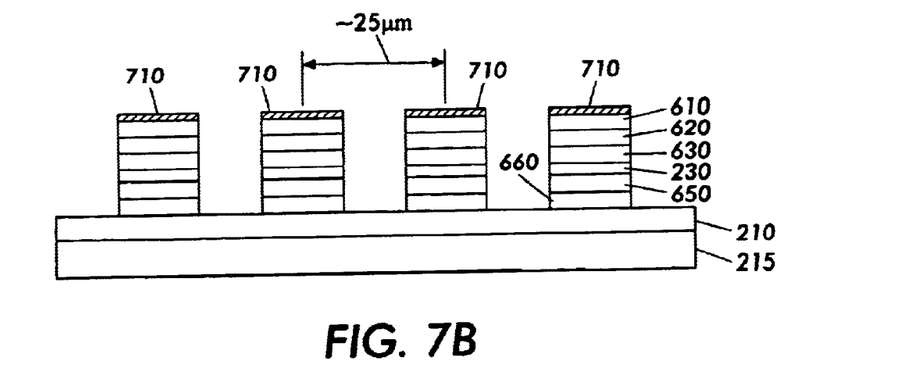
Figure 7C:
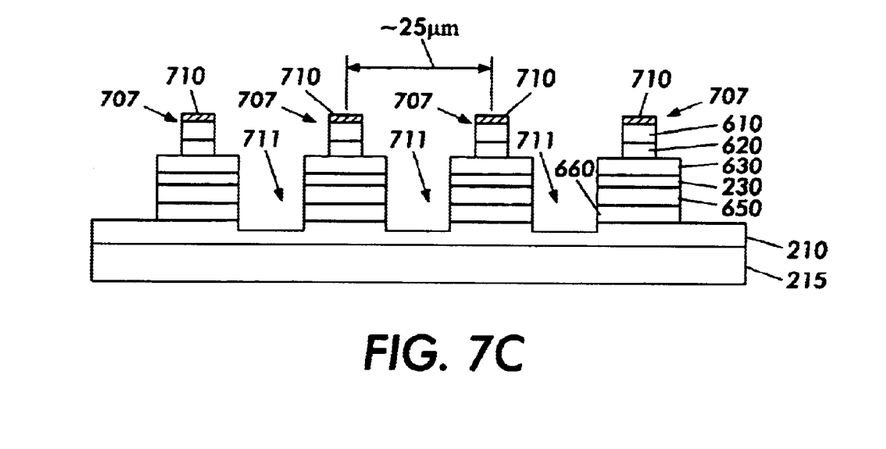
Figure 7D:
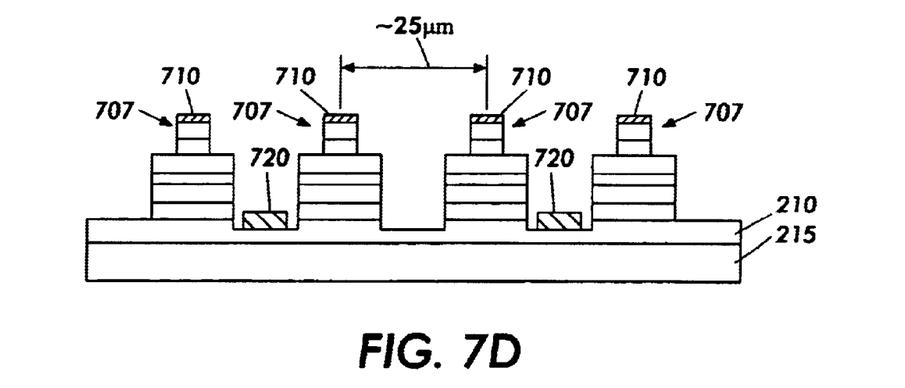

FIGS. 7a–7e show the major processing steps for a quadspot ridge waveguide laser diode structure in accordance with this invention. Note that layers 640 and 665 are not shown in FIGS. 7a–7e. FIG. 7a shows wafer 600 after p-metal deposition. P-metal layer 710 is typically nickel-gold (Ni—Au) and deposited using thermal evaporation and rapid thermal annealing in an $N_2$ ambient. Dry etching is performed using CAIBE or reactive ion etching (RIE) to etch the mesa structure shown in FIG. 7b in an $Ar/Cl_2/BCl_3$ gas mixture. The mirrors (not shown) are also dry etched using a CAIBE or RIE process. FIG. 7c shows wafer 600 after etching of ridge waveguides 707 and trenches 711 in an $Ar/Cl_2/BCl_3$ gas mixture using CAIBE or RIE. FIG. 7d shows the result of depositing n-metal 720 which is typically titanium-aluminum (Ti—Al) using thermal evaporation and rapid thermal annealing in a $N_2$ ambient.

Figure 7E:
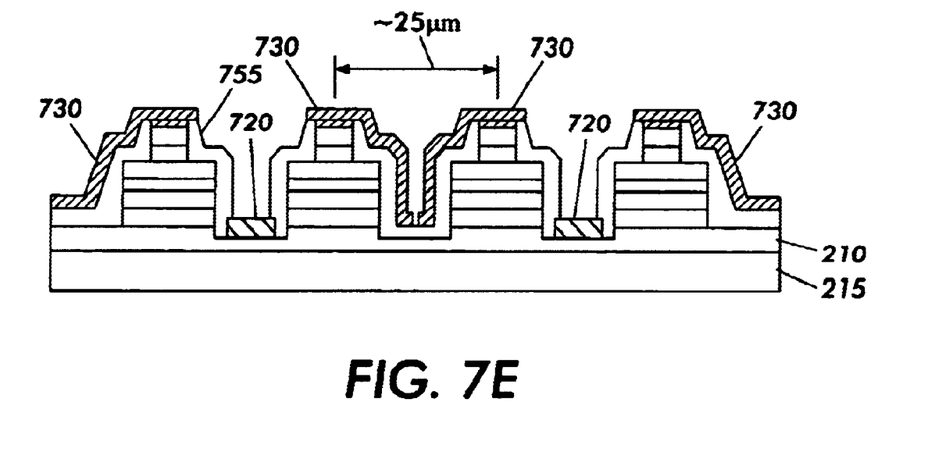

Dielectric isolation deposition is then performed using plasma enhanced chemical vapor deposition (PECVD) using, for example, silicon-oxy-nitride, silicon oxide or silicon nitride as the dielectric. Polyimide may also be used as the dielectric. Contact windows are opened in dielectric isolation layer 755 using radio frequency (RF) plasma etching in $CF_4/O_2$ ambient prior to deposition of titanium/gold p-metal contact pads using thermal evaporation. FIG. 7e shows wafer 600 after p-metal contact pad 730 and n-metal contact pad 720 deposition. Substrate 215 is then thinned by mechanical polishing to prepare wafer 600 for cleaving of laser diodes into individual devices. A final step involves using electron beam evaporation for deposition of a $SiO_2/TiO_2$ high reflective coating on the front and backside of the laser diode mirrors (not shown) to reduce the laser threshold current and protect the mirror surfaces.

Figure 8A:
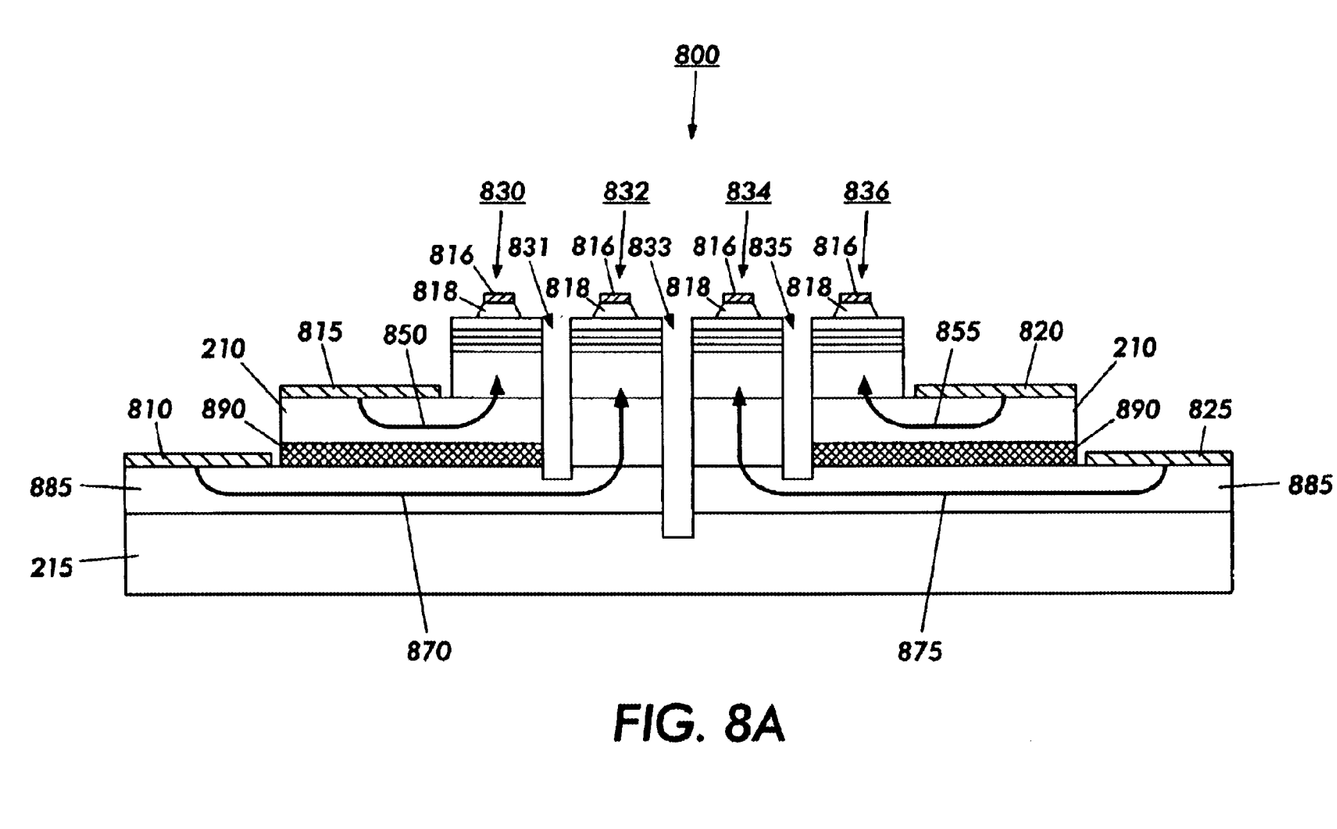
FIG. 8a shows a quad-spot laser diode structure in an embodiment in accordance with the present invention.

FIG. 8a shows an embodiment in accordance with the present invention of quadspot laser diode structure 800 built on insulating substrate 215 using GaN/AlGaN. Quadspot laser diode structure 800 uses n-GaN buried layer 210 separated from n-GaN buried layer 885 by p-GaN or AlGaN blocking layer 890 to form buried current channels 850 and 855. Buried current channels 850 and 855 go from n-metal contacts 815 and 820 to contact laser diodes 830 and 836, respectively. Buried current channels 870 and 875 go from n-metal contacts 810 and 825 to contact laser diodes 832 and 834, respectively, using n-GaN buried layer 885 which is sandwiched between p-GaN or AlGaN blocking layer 890 and insulating substrate 215. Typically, insulating substrate 215 is made of $Al_2O_3$. Laser diode pairs 830, 832; 832, 834; and 834, 836 are separated from each other both optically and electrically by grooves 831, 833 and 835, respectively.

Groove 833 is etched down through lowest GaN layer 885 while grooves 831 and 835 are etched only through p-GaN layer 890 to allow current to flow to inner laser diodes 832 and 834, respectively. GaN or AlGaN layer 890 may be made an insulating layer if desired.

Figure 8B:
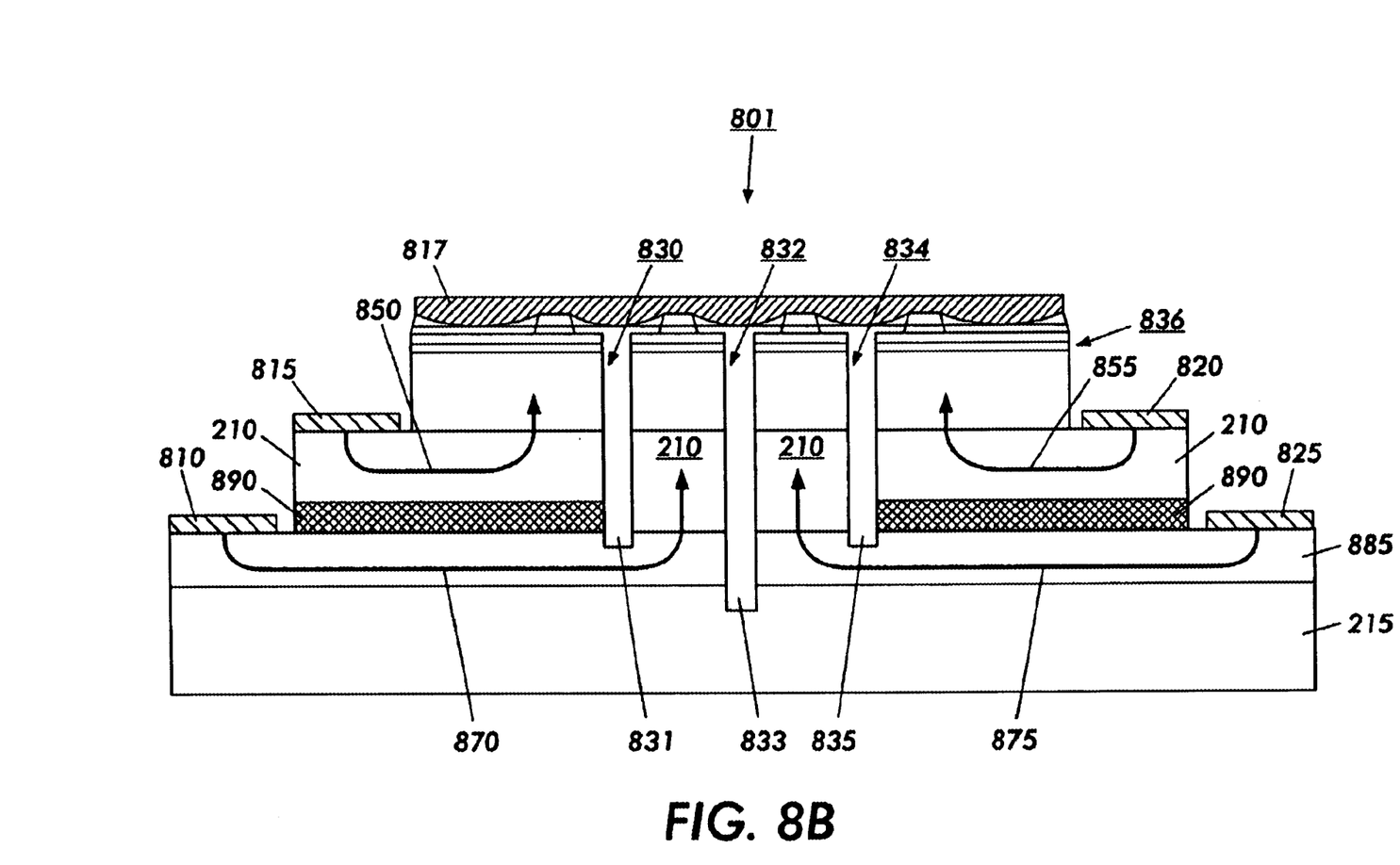
FIG. 8b shows a quad-spot laser diode structure in an embodiment in accordance with the present invention.

P-metal contact pads 816 can be arranged in several different ways as shown above in FIGS. 1–5. In FIG. 8a, individually addressable p-metal contact pads 816 are connected to laser diodes 830, 832, 834 and 836 through a window (not shown) in isolation layer (not shown) applied to p-AlGaN cladding layer 225. An alternative embodiment in accordance with the present invention is shown in FIG. 8b. FIG. 8b shows quadspot laser diode structure 801 having common p-metal contact 817 formed by filling grooves 831, 833 and 835 and areas surrounding p-GaN contact layer 818 (FIG. 8a) with an insulator such as polyimide. Addressability of individual laser diodes 830, 832, 834 and 836 is preserved through n-metal contacts 815, 810, 825 and 820, respectively. The common p-metal contact structure can be extended to more than four closely spaced laser diodes by the addition of a pair of n- and p-GaN layers for every two laser diodes added to laser diode structure 801 shown in FIG. 8b.

For some laser diode driver circuits it is more convenient to have a common n-metal contact structure for quadspot laser diode structure 801. This is readily achieved by reversal of the polarities of all layers (see FIG. 9) in quadspot laser diode structure 801. This makes buried current channels 850, 855, 870 and 875 p-type channels. However, this arrangement is not presently preferred for nitride based lasers because carrier mobility and achievable doping levels in p-type GaN are significantly lower than in n-type GaN.

Figure 9:
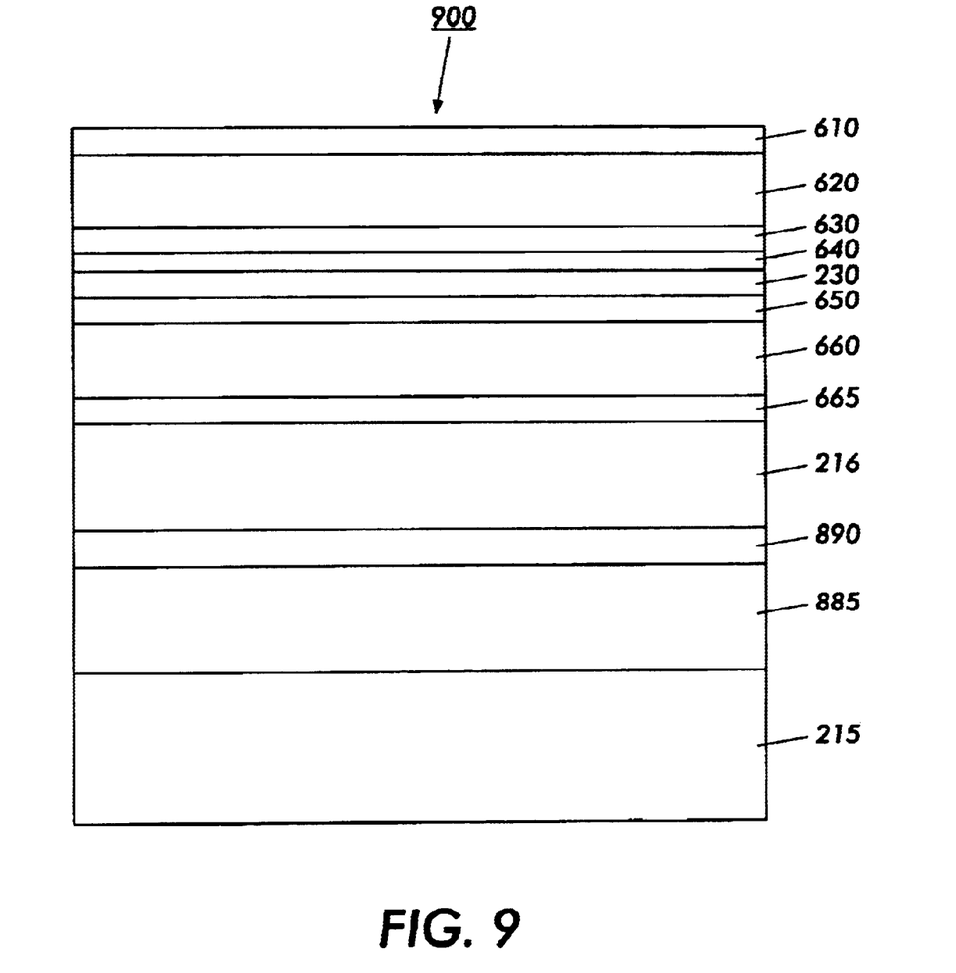
FIG. 9 shows the layers of a quad-spot laser diode structure in an embodiment in accordance with the present invention.

In an embodiment in accordance with this invention, FIG. 9 shows InGaAlN heterostructure wafer 900 grown by metalorganic chemical vapor deposition (MOCVD) on insulating substrate 215. The layer structure of wafer 900 is identical to wafer 600 of FIG. 6 except for the addition of p-(Al)GaN:Mg isolation layer 890, typically several hundred nm in thickness and second n-GaN:Si layer 885, typically at least 1–2 μm in thickness. Isolation layer 890 can also be grown as an insulator since its purpose is to provide electrical isolation of GaN layer 885 from GaN layer 210. Following growth of n-GaN layer 885 and p-GaN isolation layer 890, wafer 900 is removed from the growth reactor and isolation layer 890 is selectively removed in the regions where laser diodes 832 and 834 (see FIG. 8a) will be located. After selective removal of isolation layer 890, etched wafer 900 is returned to the growth reactor for growth of GaN:Si layer 210 and subsequent layers as in FIGS. 6 and 9. In this embodiment, GaN:Si layers 210 and 885 are doped to achieve an electron concentration of the order of $10^{18}/cm^3$ for high electrical conductivity. Individual laser diodes 830, 832, 834 and 836 are etched similarly as described above and shown in FIGS. 7a–7e.

N-metal contacts 810, 815, 820 and 825 (see FIGS. 8a and 8b) are formed by selectively removing the upper layers. Specifically, formation of n-metal contacts 815 and 820 requires selective removal of all layers down to n-GaN layer 210 and formation of n-metal contacts 810 and 825 requires selective removal of all layers down to n-GaN layer 885. Deposition of n-metal contacts 810, 815, 820 and 825 is performed by masking wafer 900 for contact metallization and lift-off patterning. N-metal contact pads 810, 815, 820 and 825 are typically Ti—Al while p-metal contact pads 816 or pad 817 are typically Ni—Au.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A structure for an array of laser diodes comprising:
   a first metallization layer comprising type one metal contacts;
   a second metallization layer comprising at least one type two metal contact;
   a plurality of active regions for generating light of a predetermined frequency disposed below said first metallization layer, each active region in said plurality of active regions electrically coupled to a corresponding type one metal contact in said first metallization layer;
   first and second waveguide structures that include, respectively, first and second ones of the active regions; each of the first and second waveguide structures further including laser mirror elements; the first waveguide structure having a first lateral surface, the second waveguide structure having a second lateral surface disposed toward and separated from the first lateral surface;
   an isolation layer of dielectric material over the first and second lateral surfaces, the dielectric material preventing optical coupling at each of the first and second lateral surfaces;
   a lateral contact layer that couples at least two active regions in the plurality of active regions for generating light to the at least one type two metal contact in the second metallization layer, the at least two active regions having the same thickness for generating light at the same predetermined frequency; and
   an insulating substrate supporting said plurality of active regions, said first and second waveguide structures, said isolation layer, said lateral contact layer, said first metallization layer and said second metallization layer.

2. The structure of claim 1 wherein said insulating substrate is comprised of $Al_2O_3$.

3. The structure of claim 1 wherein a first portion of said plurality of active regions is separated from a second portion of said plurality of active regions by a channel structure, said channel structure comprising mirrors such that light generated by said first portion and said second portion of said plurality of active regions is outcoupled by said mirrors in a direction substantially perpendicular to said metallization layer.

4. The structure of claim 1 wherein each active region in the plurality of active regions is individually addressable to allow individual switching of each active region.

5. A structure comprising:
   an insulating substrate;
   a laser diode array on the insulating substrate; the laser diode structure comprising:
      a type one metallization layer that includes first and second type one metal contacts;
      a type two metallization layer that includes first and second type two metal contacts;
      first and second active regions disposed below the type one metallization layer, the first active region being electrically coupled between the first type one and type two metal contacts, the second active region being electrically coupled between the second type one and type two metal contacts;
      a lateral contact layer that couples the first and second active regions to the first and second type two metal contacts, respectively;
      the first type one and type two metal contacts extending across the insulating substrate in a first alignment, the second type one and type two metal contacts extending across the insulating substrate in a second alignment different than the first alignment, the first and second alignments being at an angle that increases separation between the first type one and type two metal contacts and the second type one and type two metal contacts.

6. A structure for an array of laser diodes comprising:
   a metallization layer comprising type one metal contacts;
   a plurality of active regions for generating light disposed below said metallization layer, each active region electrically coupled to a corresponding contact in said metallization layer, each active region in said plurality of active regions having a common thickness, each active region in said plurality of active regions to output a common predetermined wavelength of light;
   laser mirror elements for each of the active regions;
   a type two contact layer wherein the type two contact layer includes a nitride based compound, the type two contact layer further including a type two metal contact disposed below said plurality of active regions, the type two metal contact electrically coupled to at least two active regions in said plurality of active regions; and
   an insulating substrate proximate to and supporting said type two contact layer.

7. The structure of claim 6 wherein each of said plurality of active regions has a multi-quantum well structure.

8. A structure for an array of laser diodes comprising:
   a metallization layer comprising type one metal contact;
   a plurality at active regions for generating light disposed below said metallization layer, each active region electrically coupled to a corresponding contact in said metallization layer, each active region in said plurality of active regions having a common thickness, each active region in said plurality of active regions to output a common predetermined wavelength of light;
   laser mirror elements for each of the active regions;
   a type two contact layer wherein said type two contact layer is comprised of GaN and is an n-type layer, said type two contact layer including a type two metal contact disposed below said plurality of active regions, the type two metal contact electrically coupled to at least two active regions in said plurality of active regions; and
   an insulating substrate proximate to and supporting said type two contact layer.

9. A structure for an array of laser diodes comprising:
   a metallization layer comprising type one metal contacts;
   a plurality of active regions for generating light disposed below said metallization layer, each active region electrically coupled to a corresponding contact in said metallization layer, each active region in said plurality of active regions having common thickness, each active region in said plurality of active regions to output a common predetermined wavelength of light;
   laser mirror elements for each of the active regions;
   a type two contact layer including a type two metal contact disposed below said plurality of active regions, the type two metal contact electrically coupled to at least two active regions in said plurality of active regions;
   a type one layer disposed between said plurality of active regions and said type two contact layer; and, an insulating substrate proximate to and supporting said type two contact layer.

10. A laser array to define placement of a marking material in a laser printer, the laser array comprising:
   a first metallization layer comprising type one metal contacts;
   a second metallization layer comprising at least one type two metal contact;
   a plurality of active regions for generating light of a predetermined frequency disposed below said first metallization layer, each active region in said plurality of active regions having a common thickness, each active region to output a corresponding beam of light having the predetermined frequency, each beam of light to define areas of a substrate to receive said marking material, each active region in said plurality of active regions electrically coupled to a corresponding type one metal contact in said first metallization layer;
   first and second waveguide structures that include, respectively, first and second ones of the active regions; each of the first and second waveguide structures further including laser mirror elements; the first waveguide structure having a first lateral surface, the second waveguide structure having a second lateral surface disposed toward and separated from the first lateral surface;
   an isolation layer of dielectric material over the first and second lateral surfaces, the dielectric material preventing optical coupling at each of the first and second lateral surfaces;
   a lateral contact layer that couples at least two active regions in the plurality of active regions for generating light to the at least one type two metal contact in the second metallization layer, the at least two active regions having the same thickness for generating light at the same predetermined frequency; and
   an insulating substrate supporting said plurality of active regions, said first and second waveguide structures, said isolation layer, said lateral contact layer, said first metallization layer and said second metallization layer.

11. A laser array, comprising:
   an insulating substrate with a surface;
   a laser array structure formed on the substrate's surface, the laser array structure including two or more lasers; each laser having a waveguide structure that includes an active region for generating light in response to a respective electrical signal; each laser amplifying its generated light through stimulated emission of radiation with optical feedback to obtain coherent light, at least part of the coherent light from each laser being coupled out of the laser; the structure further including:
      a first metallization layer that includes contacts of a first type and at least one second metallization layer that includes contacts of a second type; each laser's active region being connected to receive its respective electrical signal through one of the contacts of the first type and one of the contacts of the second type; each laser's active region being between the first metallization layer and the insulating substrate;
      the lasers including first and second lasers adjacent to each other, the waveguide structure of the first laser having a first lateral surface, the waveguide structure of the second laser having a second lateral surface disposed toward and separated from the first lateral surface;
      an isolation layer of dielectric material over the first and second lateral surfaces, the dielectric material preventing optical coupling at each of the first and second lateral surfaces; and
      a lateral contact structure through which the active regions of at least two of the lasers are electrically connected to contacts of the second type.

12. The laser array of claim 11 in which each laser includes two mirror facets perpendicular to the substrate surface and parallel to each other, the two mirror facets providing optical feedback within the laser and one of the mirror facets coupling coherent light out of the laser.

13. The laser array of claim 11 in which the active regions of all the lasers are of the same thickness for generating light at the same frequency.

14. The laser array of claim 11 in which the active region of each laser is electrically connected to a respective contact of the second type, the respective contact of the second type for each laser not being connected to the active region of any other laser.

15. The laser array of claim 14 in which the active region of each laser is further electrically connected to a respective contact of the first type, the respective contact of the first type for each laser not being connected to the active region of any other laser; the respective contacts of the first and second types for first and second lasers extending across the insulating substrate in two different alignments; the two different alignments being at an angle that increases separation between the first and second lasers.

16. The laser array of claim 14 in which the lateral contact structure comprises first and second lateral contact layers; the first lateral contact layer electrically connecting the first laser's active region to its respective contact of the second type; the second lateral contact layer electrically connecting the second laser's active region to its respective contact of the second type.

17. The laser array of claim 11 in which the active regions of two lasers are both electrically connected to one shared contact of the second type.

18. The laser array of claim 11 in which the lateral contact structure includes an n-type semiconductor layer, the active regions being electrically connected to contacts of the second type through the n-type semiconductor layer; the laser array structure further including a p-type semiconductor layer between the active regions of the lasers and the first metallization layer, the active regions being electrically connected to contacts of the first type through the p-type semiconductor layer.

19. The laser array of claim 11 in which the dielectric material is silicon oxy-nitride, silicon dioxide, silicon nitride, or polyimide.

* * * * *